United States Patent
Latif et al.

(10) Patent No.: US 10,069,658 B2
(45) Date of Patent: Sep. 4, 2018

(54) PULSED DECISION FEEDBACK EQUALIZATION CIRCUIT

(71) Applicant: INTEL CORPORATION, Santa Clara, CA (US)

(72) Inventors: Salman Latif, Mountain View, CA (US); Ravindran Mohanavelu, Belmont, CA (US); Sitaraman V. Iyer, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/863,300

(22) Filed: Sep. 23, 2015

(65) Prior Publication Data

US 2017/0085399 A1 Mar. 23, 2017

(51) Int. Cl.
*H04L 25/03* (2006.01)
*H03M 1/72* (2006.01)

(52) U.S. Cl.
CPC .. *H04L 25/03146* (2013.01); *H04L 25/03006* (2013.01); *H03M 1/72* (2013.01)

(58) Field of Classification Search
CPC ............... H04L 25/03; H04L 25/03006; H04L 25/03019; H04L 25/03057; H04L 25/0349; H04L 27/01; H04L 25/03146; H03M 1/0607; H03M 1/72
USPC ........ 375/232, 233, 346, 348, 350; 708/322, 708/323
See application file for complete search history.

(56) References Cited

U.S. PATENT DOCUMENTS

| 7,924,912 B1* | 4/2011 | Rokhsaz ........... H04L 25/03057 375/229 |
| 9,143,368 B1 | 9/2015 | Ben Artsi et al. |
| 2005/0052255 A1* | 3/2005 | Chiang ................... H01P 3/081 333/18 |
| 2008/0005493 A1* | 1/2008 | Chung ................. G11C 7/1075 711/149 |
| 2009/0252215 A1 | 10/2009 | Bulzacchelli et al. |
| 2010/0135378 A1* | 6/2010 | Lin ....................... H04L 7/0025 375/233 |

(Continued)

OTHER PUBLICATIONS

International Search Report and Written Opinion dated Nov. 16, 2016 for International Application No. PCT/US2016/046392, 14 pages.

*Primary Examiner* — Young T Tse
(74) *Attorney, Agent, or Firm* — Schwabe, Williamson & Wyatt, P.C.

(57) ABSTRACT

Embodiments include a pulsed decision feedback equalization (DFE) circuit. The DFE circuit may include a current integrating summer (CIS) circuit that passes one or more data signals on respective data nodes based on an input data signal and a clock signal. The DFE circuit may further include a correction circuit, such as a current digital-to-analog converter (IDAC) circuit, that may provide a correction circuit to a data node based on a prior bit of the input data signal. The correction circuit may provide a conductive path between a current source of the correction circuit and the data node for a time period that is less than the unit interval (UI) of the clock signal and/or data signal. The DFE circuit may include a plurality of correction circuits to provide respective correction signals based on different prior bits of the input data signal. Other embodiments may be described and claimed.

20 Claims, 6 Drawing Sheets

(56) References Cited

U.S. PATENT DOCUMENTS

| | | | |
|---|---|---|---|
| 2010/0329322 A1* | 12/2010 | Mobin | H04L 25/03057 375/231 |
| 2011/0274154 A1 | 11/2011 | Aziz et al. | |
| 2013/0021074 A1 | 1/2013 | Finn et al. | |
| 2013/0208779 A1* | 8/2013 | Agrawal | H04L 27/01 375/232 |
| 2013/0214865 A1* | 8/2013 | Bulzacchelli | H03F 1/0261 330/261 |
| 2013/0257483 A1* | 10/2013 | Bulzacchelli | H03K 3/356139 327/53 |
| 2014/0269889 A1* | 9/2014 | Xu | H04L 25/03057 375/233 |
| 2015/0078430 A1 | 3/2015 | Lee et al. | |
| 2016/0065394 A1* | 3/2016 | Sindalovsky | H04L 25/03012 375/371 |

* cited by examiner

Figure 6

PULSED DECISION FEEDBACK EQUALIZATION CIRCUIT

FIELD

Embodiments of the present invention relate generally to the technical field of electronic circuits, and more particularly to a pulsed decision feedback equalization circuit.

BACKGROUND

A decision feedback equalization (DFE) circuit is used in high speed serial link receivers to cancel intersymbol interference (ISI) from previous bits. In some DFE circuits, a cancellation signal provided by a current source cell is summed with the input data signal at an output node. However, the charge sharing by the current source cell at the output node contributes noise to the data signal.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments described herein include a pulsed decision feedback equalization (DFE) circuit. The DFE circuit may be included in a receiver circuit to receive an input data signal. The DFE circuit may include a current integrating summer (CIS) circuit that provides one or more data signals on respective data nodes based on the input data signal. The DFE circuit may further include a correction circuit, such as a current digital-to-analog converter (IDAC) circuit, that may provide a correction signal to a data node based on a prior bit of the input data signal. The correction circuit may provide a conductive path between a current source of the correction circuit and the data node for a time period that is less than the unit interval (UI) of the data signal and/or a clock signal associated with the data signal. The DFE circuit may include a plurality of correction circuits to provide respective correction signals based on different prior bits of the input data signal. The correction signals may be summed with the data signal on the data node to generate a corrected data signal. The receiver circuit may use the corrected data signal to determine the bit values of the input data signal.

Figure 1:
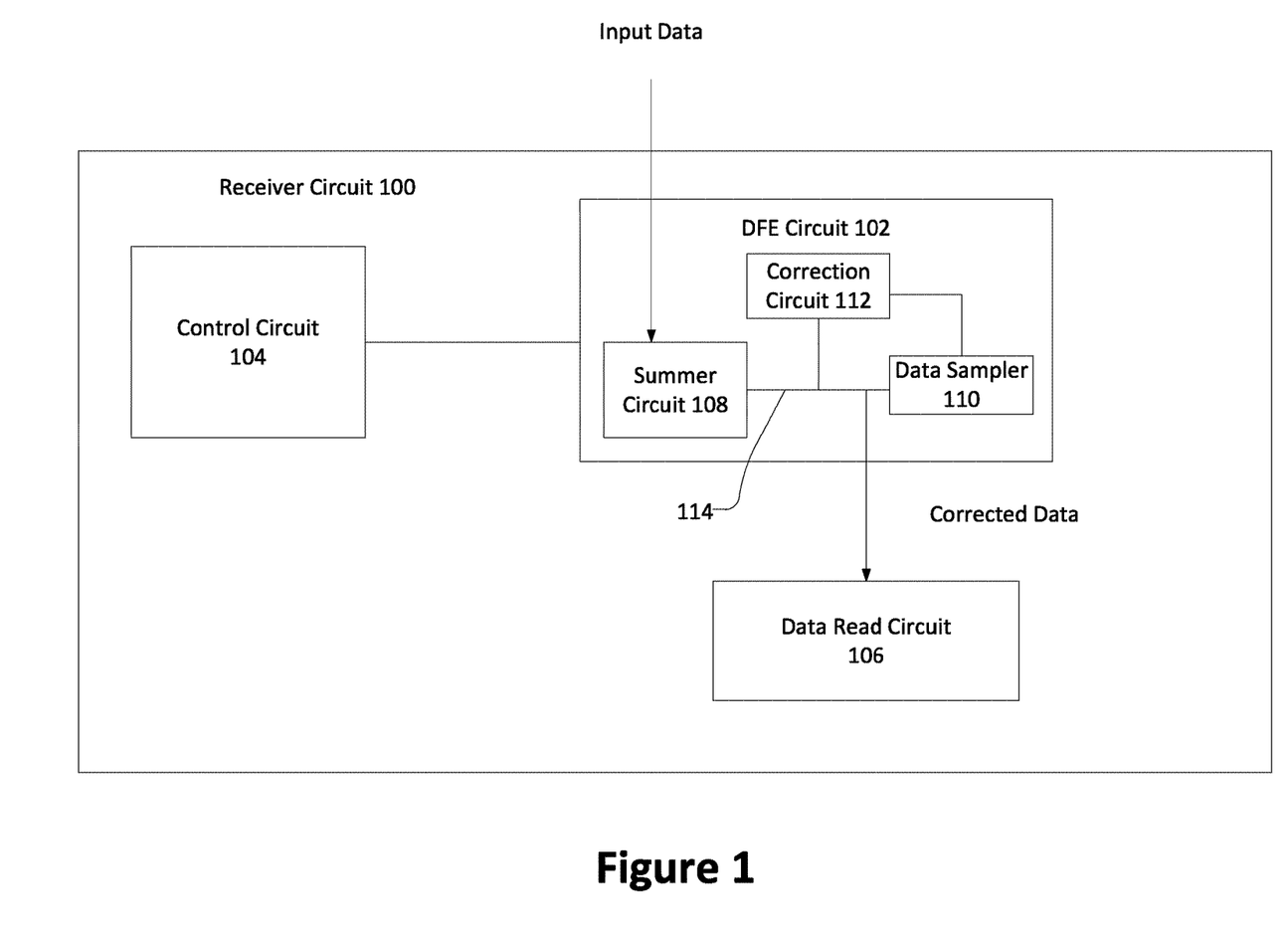
FIG. 1 schematically illustrates a receiver circuit including a decision feedback equalization (DFE) circuit, in accordance with various embodiments.

For example, FIG. 1 illustrates a receiver circuit 100 including a DFE circuit 102 coupled to a control circuit 104 and a data read circuit 106, in accordance with various embodiments. The receiver circuit 100 may be included in a communication device to receive a data signal (e.g., from another communication device and/or another component in the communication device). In various embodiments, the DFE circuit 102 may receive an input data signal and may generate a corrected data signal to cancel intersymbol interference (ISI) from prior bits of the input data signal. For example, the DFE circuit 102 may include a summer circuit 108 (e.g., a CIS circuit), a data sampler circuit 110, and one or more correction circuits 112. The summer circuit 108 may provide one or more data signals on respective data nodes 114 based on the input data signal. The sampler block may provide values of prior bits of the input data signal to the correction circuits 112. The correction circuits 112 may provide correction signals to the data nodes 114 based on the prior bits of the input data signal and responsive to one or more control signals provided by the control circuit 104. The correction signals may be summed with the data signals on the data nodes 114 (e.g., by the summer circuit 108) to generate the corrected data signals.

In some embodiments, the correction circuits 112 may be current source cells (e.g., current digital-to-analog converters (IDACs)) that include a current source that is selectively coupled with one or more of the data nodes 114 to provide the correction signal. In various embodiments, the one or more control signals may be pulsed control signals (e.g., with a duty cycle that is different than 50%) to cause the correction circuits 112 to pass the respective correction signals for less than one unit interval (UI) of the clock signal and/or data signal. For example, the correction circuits 112 may provide a conductive path between a current source of the correction circuit 112 and the data node 114 for a time period that is less than the unit interval (UI) of the clock signal and/or data signal. Conductively connecting the current source with the data node 114 for a shorter time period may reduce the effect of noise/jitter that may be introduced by the current source (e.g., by capacitance at the current source drain node).

The data read circuit 106 may read the data from the input data signal using the corrected data signal. The ISI cancellation provided by the DFE circuit 102 may improve performance of the data read circuit 106, and may provide reduced noise/jitter in the corrected data signals than prior DFE circuits.

In various embodiments, the receiver circuit 100 may receive data signals in accordance with any suitable communication protocol, such as a Universal Serial Bus (USB) interface, a general-purpose input/output (GPIO) interface, a Camera Serial Interface (CSI), a Mobile Industry Processor Interface (MIPI) M-PHY interface, a Peripheral Component Interconnect express (PCIe) interface, a Serial Advanced Technology Attachment (SATA) interface, an Ethernet interface, and/or another high-speed input/output interface (e.g., a wired interface). In some embodiments, the receiver circuit 100 may be used to receive a differential data signal. Accordingly, the receiver circuit 100 may be coupled to a pair of I/O contacts (not shown) coupled to respective transmission lines to pass the differential data signals. In some embodiments, additional transmission lines may be coupled between the communication devices or components, for example, to carry a ground signal and/or electrical power. In some embodiments, at least a portion of the transmission lines may be part of a cable connected between the communication devices. In other embodiments, the receiver circuit 100 may receive a single-ended data signal on a single transmission line.

In some embodiments, the receiver circuit 100 may be included in a transceiver circuit that also includes transmit circuitry.

Figure 2:
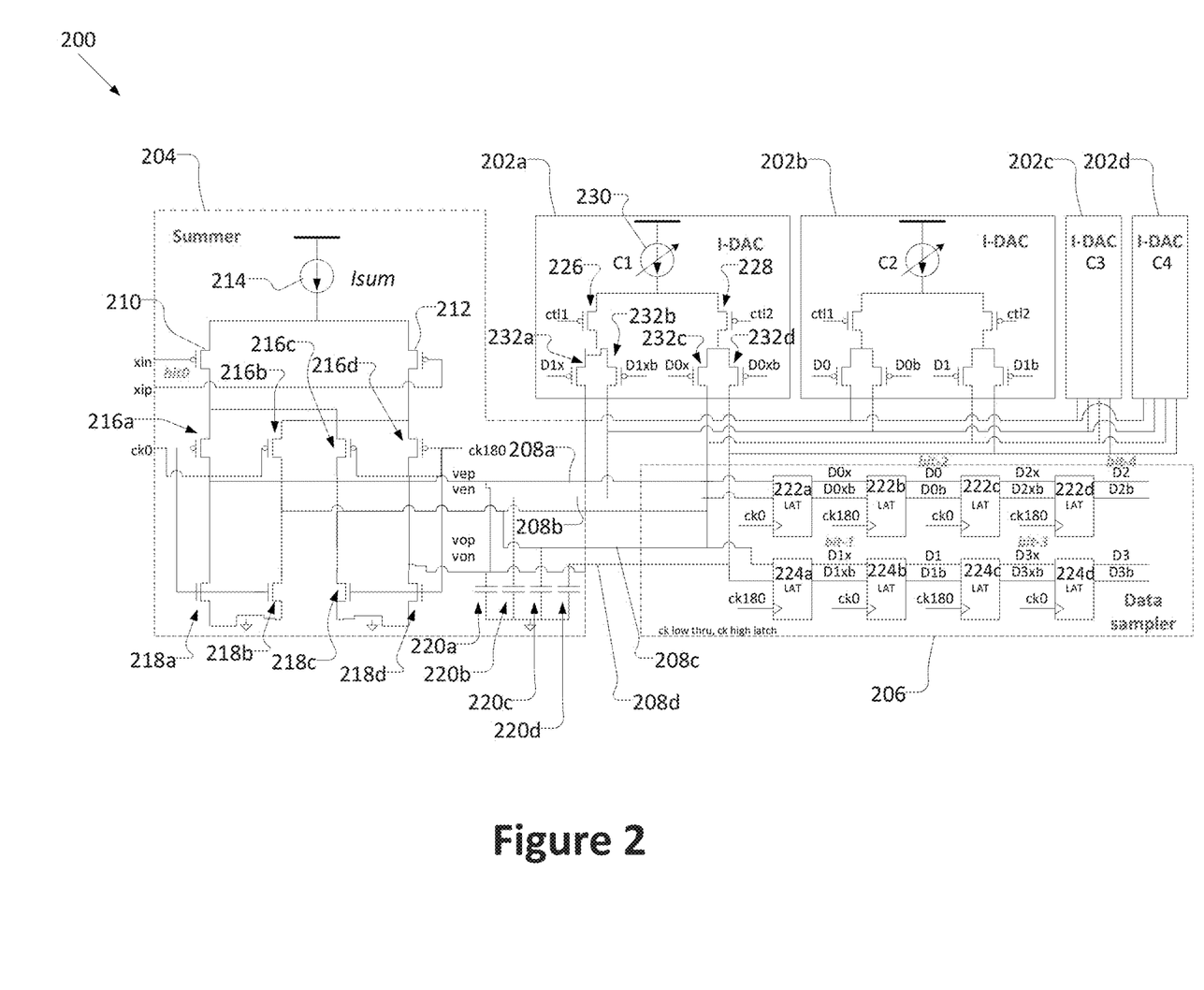
FIG. 2 schematically illustrates a DFE circuit, in accordance with various embodiments.

FIG. 2 illustrates a DFE circuit 200 in accordance with various embodiments. The DFE circuit 200 may correspond to the DFE circuit 102 in FIG. 1. The DFE circuit 200 may include one or more IDACs 202a-d, a CIS 204, and a data sampler block 206 coupled to one another as shown.

In various embodiments, the CIS 204 may receive a differential input data signal including positive input data signal xip and negative input data signal xin. In some embodiments, the input data signal (e.g., xip and xin) may be a voltage signal. The CIS 204 may convert the input data signal from a voltage signal to a current signal (e.g., a differential current signal) at nodes 208a-d.

In some embodiments, the CIS 204 may further separate the input data signal into even and odd portions to allow the DFE circuit 200 to operate at half of the clock rate of the input data signal. Accordingly, the CIS 204 may be referred to as a 1:2 demultiplexed CIS. For example, the CIS 204 may generate an even positive data signal at node 208a, an even negative data signal at node 208b, an odd positive data signal at node 208c, and an odd negative data signal at node 208d. In other embodiments, the DFE circuit 200 may operate at full clock rate or at a different clock rate.

In some embodiments, as shown in FIG. 2, the CIS 204 may receive the negative input data signal xin at a first input transistor 210 and may receive the positive input data signal xip at a second input transistor 212. The negative input data signal xin may be an inverse of the positive input data signal. The first input transistor 210 and second input transistor 212 may be coupled with a summer current source 214 to provide current that is passed through the first input transistor 210 or second input transistor 212. When the input data signal has a first logic value, the first input transistor 210 may conduct more current than the second input transistor 212, and when the input data signal has a second logic value, the second input transistor 212 may conduct more current than the first input transistor 210.

The CIS 204 may further include p-type transistors 216a-d and n-type transistors 218a-d. Transistors 216a-b and 218a-b may receive a first data clock signal (ck0) associated with the input data signal at their respective gate terminals, and transistors 216c-d and 218c-d may receive a second data clock signal (ck180) associated with the input data signal at their respective gate terminals. The second data clock signal may be an inverted or 180-degree phase-shifted version of the first data clock signal. In some embodiments, the first and second data clock signals may be half-rate clocks that are half the rate of the input data signal (e.g., to divide the input data signal into even and odd portions).

As shown, the node 208a may be coupled between the transistors 216a and 218a to receive the even positive output signal vep, the node 208b may be coupled between the transistors 216b and 218b to receive the even negative output signal ven, the node 208c may be coupled between the transistors 216c and 218c to receive the odd positive output signal vop, and the node 208d may be coupled between the transistors 216d and 218d to receive the odd negative output signal von at node 208d. Although transistors 210, 212, and 216a-d are shown as p-type transistors, and transistors 218a-d are shown as n-type transistors, other embodiments may include any other suitable types of transistors.

In various embodiments, the IDACs 202a-d may provide correction signals to the respective nodes 208a-d based on a data pattern of the input data signal (e.g., based on values of previous bits of the input data signal). The correction signals may be summed with the respective output current signals generated by the CIS 204 at the nodes 208a-d to generate corrected data signals (e.g., vep at node 208a, ven at node 208b, vop at node 208c, and von at node 208d). The corrected data signals may be passed to the sampler block 206.

In some embodiments, the corrected data signals may be converted from current signals to voltage signals by capacitors 220a-d that are coupled between the respective nodes 208a-d and ground. Accordingly, the sampler block 206 may receive the corrected data signals as voltage signals. In some embodiments, the capacitors 220a-d may have programmable capacitance values. Additionally, or alternatively, in some embodiments, the capacitors 220a-d may be metal finger capacitors.

In some embodiments, the DFE circuit 200 may be used to cancel ISI from multiple previous bits of the input data signal. Individual IDACs 202a-d may be used to cancel ISI from respective previous bits of the input data signal. The DFE circuit 200 may be described as having a number of taps equal to the number of previous bits for which the DFE circuit 200 corrects ISI, and the number of taps may correspond to the number of IDACs 202a-d. For example, DFE circuit 200 is shown to be a 4-tap DFE circuit that includes 4 IDACs 202a-d. IDAC 202a may cancel ISI from the bit prior to the current bit, IDAC 202b may cancel ISI from the bit that is 2 bits prior to the current bit, IDAC 202c may cancel ISI from the bit that is 3 bits prior to the current bit, and IDAC 202d may cancel ISI from the bit that is 4 bits prior to the current bit.

In various embodiments, the sampler block 206 may receive the corrected data signals and may generate and/or store running values of the previous bits. For example, the sampler block 206 may include latches 222a-d on the even data path and latches 224a-d on the odd data path. Latch 222a may receive the corrected even positive data signal and the corrected even negative data signal at respective input terminals. The latch 222a may further receive the first clock signal (ck0) at a trigger input. When the first clock signal has a first value (e.g., logic low), the latch 222a may pass the corrected even positive data signal vep and the corrected even negative data signal ven to respective output terminals. When the first clock signal transitions to a second value (e.g., logic high), the latch 222a may latch and hold the values of the signals at the output terminals. Thus, the values of the signals at the output terminals, D0x and D0xb, may correspond to the previous bit of the vep or ven signals, respectively.

The input terminals of the latch 222b may be coupled with the output terminals of the latch 222a to receive the signals D0x and D0xb. The latch 222b may generate signals D0 and D0b at its output terminals that have values that correspond to the bit that is 2 bits prior to the present bit of the vep signal and the ven signal, respectively. In some embodiments, a trigger input of the latch 222b may receive the second clock signal (ck180) to trigger latching of the latch 222b.

In a similar manner, the latch 222c may generate signals D2x and D2xb that have values that correspond to the bit that is 3 bits prior to the present bit of the vep signal and the ven signal. The latch 222d may generate signals D2 and D2b that have values that correspond to the bit that is 4 bits prior to the present bit of the vep signal and the ven signal.

In various embodiments, the latches 224a-d may operate in a similar manner to generate and latch the prior values of the corrected odd positive data signal vop and the corrected odd negative data signal von. For example, the latch 224a may generate signals D1x and D1xb that have values that correspond to the previous bit of the vop and von signals. Latch 224b may generate signals D1 and D1b that have values that correspond to the bit that is 2 bits prior to the present bit of the vop and von signals, respectively. Latch 224c may generate signals D3x and D3xb that have values that correspond to the bit that is 3 bits prior to the present bit of the vop and von signals, respectively. Latch 224d may generate signals D3 and D3b that have values that correspond to the bit that is 3 bits prior to the present bit of the vop and von signals, respectively.

In various embodiments, the IDACs 202a-d may receive respective sets of the signals generated by the sampler block 206 that correspond to the prior values of the vep, ven, vop, and von signals. The IDACs 202a-d may generate the respective correction signals based on the respective sets of signals received from the sampler block 206. For example, the IDAC 202a may receive the signals generated by the latches 222a and 224a (e.g., D0x, D0xb, D1x, and D1xb), the IDAC 202b may receive the signals generated by the latches 222b and 224b (e.g., D0, D0b, D1, and D1b), the IDAC 202c may receive the signals generated by the latches 222c and 224c (e.g., D2x, D2xb, D3x, and D3xb), and the IDAC 202d may receive the signals generated by the latches 222d and 224d (e.g., D2, D2b, D3, and D3b).

Referring to IDAC 202a as an example, IDAC 202a may include access transistors 226 and 228 having their source terminals coupled to a current source 230. In some embodiments, the current source 230 may be a programmable current source, and a value of the current generated by the current source 230 may be based on a digital code. The transistor 226 may receive a first control signal (ctl1) at its gate terminal, and the transistor 228 may receive a second control signal (ctl2) at its gate terminal. In various embodiments, the first and second control signals may be pulsed control signals. In some embodiments, the first and second control signals may also be periodic. By pulsed, periodic control signals, it is meant that the first and second control signals are pulsed "on" to turn on the respective transistor 226 or 228 for a pulse time period that is less than half of the period of the control signals. The first and second control signals may be "off" to turn off the respective transistor 226 or 228 for a time period that is greater than half of the period of the control signals (e.g., for the period of the control signal minus the pulse time period). For example, if transistors 226 and 228 are p-type transistors, the first and second control signals may be at ground voltage (0V) during the pulse to turn on the respective transistor 226 or 228, and may be at Vcc between pulses to turn off the respective transistor 226 or 228. In some embodiments, the second control signal may be a 180-degree phase-shifted version of the first control signal (e.g., shifted by half of the period of the control signals).

In various embodiments, the IDAC 202a may further include data transistors 232a-d. Transistor 232a may be coupled between the access transistor 226 and the node 208a, transistor 232b may be coupled between the access transistor 226 and the node 208b, transistor 232c may be coupled between the access transistor 228 and the node 208c, and transistor 232d may be coupled between the access transistor 228 and the node 208d. Accordingly, transistors 226, 232a, and 232b may be used to correct the even data signals vep and ven, and transistors 228, 232c, and 232d may be used to correct the odd data signals vop and von. Although transistors 226, 228, and 232a-d are depicted in FIG. 2 as p-type transistors, other embodiments may include any other suitable types of transistors.

In various embodiments, the transistor 232a may receive signal D1x at its gate terminal, transistor 232b may receive signal D1xb at its gate terminal, transistor 232c may receive signal D0x at its gate terminal, and transistor 232d may receive signal D0xb at its gate terminal. When the first control signal pulses on, the access transistor 226 may turn on. One of the transistor 232a or the transistor 232b may be on and the other of the transistor 232a or the transistor 232b may be off depending on the values of the signals D1x and D1xb (e.g., based on the values of the prior bit of the input data signal). For example, if the prior bit of the positive input data signal has a first value (e.g., logic 0), the transistor 232a may be on and the transistor 232b may be off. Accordingly, the transistor 232a may pass a correction signal (e.g., provided by the current source 230) to the node 208a during the pulse of the first control signal. If the prior bit of the positive input data signal has a second value (e.g., logic 1), the transistor 232b may be on and the transistor 232a may be off. Accordingly, the transistor 232b may pass a correction signal (e.g., provided by the current source 230) to the node 208b during the pulse of the first control signal.

The first control signal may pulse on during the even cycle of the input data signal (e.g., when the first clock signal ck0 has a first value to turn on the transistors 216a and 216b, and the second clock signal ck180 has a second value to turn off the transistors 216c and 216d). For example, in some embodiments, the first control signal may pulse on starting at the beginning of the even cycle of the input data signal (e.g., responsive to a transition in the first clock signal). The second control signal may be off during the even cycle of the input data signal, and thus transistor 228 may be off.

In various embodiments, the second control signal, access transistor 228, data transistor 232c, and data transistor 232d may be used to provide a correction signal during the odd cycle of the input data signal (e.g., when the first clock signal ck0 has the second value to turn off the transistors 216a and 216b, and the second clock signal ck180 has the first value to turn on the transistors 216c and 216d). The second control signal may pulse on during the odd cycle of the input data signal (e.g., starting at the beginning of the odd cycle of the input data signal) to turn on the access transistor 228. The transistor 232c may receive bit D0x, which corresponds to the prior bit of the input data signal during the odd cycle of the input data signal. Transistor 232d may receive bit D0xb, which may be the inverse of bit D0x. Accordingly, depending on the values of D0x and D0xb, either transistor 232c or transistor 232d will turn on to conductively couple the current source 230 with the respective node 208c or 208d, and thereby provide the correction signal.

In some embodiments, the current source 230, access transistors 226 and 228, and transistors 232a-d may be included in a positive cell of the IDAC 202a that is to provide a positive correction signal (e.g., a positive current), and the IDAC 202a may further include a negative cell (not shown for ease of illustration) that is to provide a negative correction signal (e.g., a negative current). The negative cell may include similar components to those of the positive cell, but may apply the negative correction signal to the corresponding positive node when the positive cell applies the positive correction signal to the corresponding negative node, and may apply the negative correction signal to the corresponding negative node when the positive cell applies the positive correction signal to the corresponding positive node. For example, when the positive cell provides the positive correction signal to the node 208a (e.g., responsive to the pulse in the first control signal and based on the values of the signals D1x and D1xb), the negative cell may provide the negative correction signal to the node 208b.

In various embodiments, the corrected data signals may be used by the receiver circuit to read the data. The DFE circuit 200 may correct ISI from the prior data bits to improve performance of the receiver circuit.

In some embodiments, one or more of the IDACs 202a-d may not include the access transistors (e.g., access transistors 226 and 228 of IDAC 202a). In these embodiments, the data switches may receive pulsed versions of the signals that correspond to the prior bit (e.g., D1x, D1xb, D0x, D0xb) as control signals. Such a configuration may be used, for example, if the DFE circuit 200 uses soft decision data sampler outputs for the first tap (e.g., the outputs of latches 222a and 224a that are passed to IDAC 202a). With soft decision data sampler outputs, the output signals of the latches 222a and 224b may reset to voltage Vcc every other UI (e.g., during the odd cycle for the latch 222a on the even path and during the even cycle for the latch 224a on the odd path). In some embodiments, the IDAC 202a may use the configuration that omits the access transistors 226 and 228 and uses pulsed versions of the D1x, D1xb, D0x, and D0xb as respective control signals, while the remaining IDACs 202b-d may include the access transistors.

In various embodiments, the use of the pulsed first control signal and second control signal, as described herein, may reduce the amount of time that the current sources (e.g., current source 230) of the IDACs 202a-d are conductively coupled with the nodes 208a-d compared with a DFE circuit that uses 50% duty cycle clock signals to control the IDACs. Accordingly, the reduced time period of conductive coupling between the current sources of the IDACs 202a-d and the nodes 208a-d may reduce the noise/jitter introduced by the IDACs 202a-d (e.g., by parasitic capacitance at the node of the current source). The pulsed first and second control signals may still allow a same correction range for the DFE circuit 200 as would be provided if the first clock signal (ck0) and second clock signal (ck180) were used for the first and second control signals, respectively.

Figure 3:
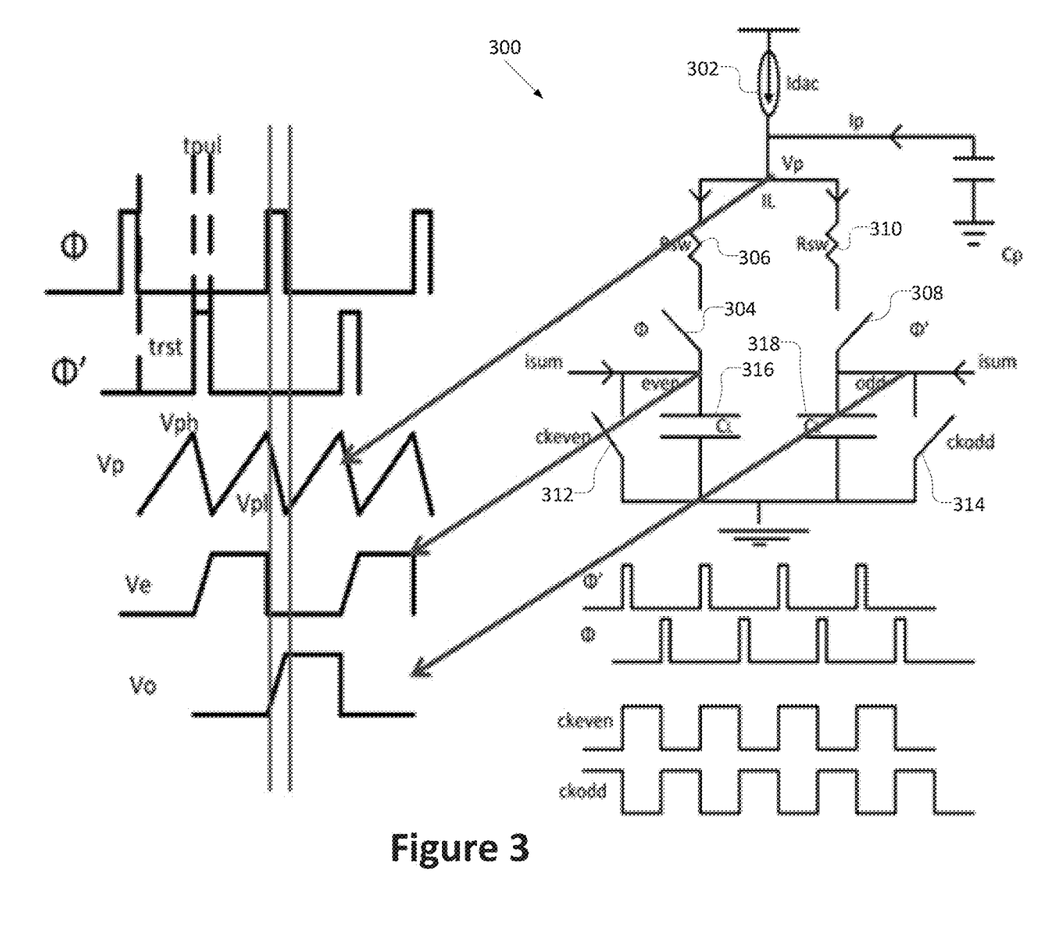
FIG. 3 schematically illustrates a simplified model of a DFE circuit, in accordance with various embodiments.

To illustrate, FIG. 3 shows a simplified schematic of a DFE circuit 300 and sample waveforms for various signals at different nodes of the DFE circuit 300. The DFE circuit 300 may correspond to the DFE circuit 200 in some embodiments.

The current source 302 of the DFE circuit 300 may correspond to the current source 230 of the IDAC 202a. The access transistor 226 and transistors 232a-b of the IDAC 202a may be represented in combination by a switch 304 and switch resistor 306 (with resistance Rsw). The access transistor 228 and transistors 232c-d may be represented in combination by a switch 308 and switch resistor 310 (with resistance Rsw). The current isum and clock switches 312 and 314 are used to model the data signals present at the data nodes 208a-d of the DFE circuit 200, and capacitors 316 and 318 may be used to model the capacitance at the nodes 208a-d (e.g., provided by the capacitors 220a-d). The clock switch 312 may be controlled by an even clock signal ckeven (e.g., corresponding to the first clock signal ck0 of FIG. 2), and the clock switch 314 may be controlled by an odd clock signal ckodd (e.g., corresponding to the second clock signal ck180 of FIG. 2). The clock switches 312 and 314 may be closed (e.g., conducting) when the corresponding clock signal is high (although the DFE circuit 200 in FIG. 2 is shown to use p-type switches that conduct with the control/clock signal is low).

In various embodiments, the voltage at the drain node of the current source 302 is defined as Vp. The current contributed by Cp, the parasitic capacitance at the drain node of the current source 302, is defined as Ip.

In various embodiments, the switch 304 may receive a first control signal ($\Phi$), and the switch 306 may receive a second control signal ($\Phi'$). The first and second control signals of FIG. 3 may correspond to the first and second control signals of FIG. 2.

If the clock signals ckeven and ckodd were used for the first and second control signals to steer the IDAC current between the even and odd summer outputs, the DFE correction voltage, DFEDAC Correction, provided by the IDAC would be given by:

$$DFEDAC \text{ Correction} = \frac{Idac \times T}{C_L} \qquad (1)$$

Where Idac is the current provided by the current source 302, T is the unit interval (UI) of the clock signals ckeven and ckodd (e.g., the duration of the integration and reset cycles), and $C_L$ is the capacitance at the summer output nodes (e.g., corresponding to the nodes 208ad).

For the pulsed first and second control signals (Φ and Φ'), pulse time period tpul may be the duration of the "on" pulse that turns on the respective switch 304 or 308, reset time period trst is the remainder of the half cycle of the clock signal (e.g., ckeven or ckodd) during which the switch 304 or 308 is open. The sum of tpul and trst is equal to T, the UI duration. The voltage, Vp, at the drain node of the current source 302 increases when the clock switches 312 and 314 are not conducting since there is no other path for the feedback current Idac except charging up Cp. During the period of time that the pulsed control signals Φ or Φ' are high, Idac and Ip have a path to charge up $C_L$, and so Vp decreases for the duration of tpul as charge flows from $C_P$ to $C_L$. The summer output waveforms Ve and Vo shown in FIG. 3 only take into account the IDAC contribution and the reset to ground every other UI (the summer current contribution is not shown). In steady state, there is no charge accumulation on node capacitor $C_P$. Therefore:

$$Idac \times trst = Ip \times tpul \qquad (2)$$

Additionally, the DFE correction voltage is:

$$DFEDAC \text{ Correction} = \frac{(Ip + Idac) \times tpul}{C_L} \qquad (3)$$

Substituting for Ip from Eq (2), we get:

$$DFEDAC \text{ Correction} = \frac{Idac \times \left(1 + \frac{trst}{tpul}\right) \times tpul}{C_L} \qquad (4)$$

$$DFEDAC \text{ Correction} = \frac{Idac \times (tpul + trst)}{C_L} \qquad (5)$$

Given that tpul+trst=T, we get:

$$DFEDAC \text{ Correction} = \frac{Idac \times T}{C_L} \qquad (6)$$

Equation (6) gives the same expression for the DFE correction voltage as Equation (1). Therefore, the amount of DFE correction is the same for the pulsed DFE scheme using pulsed control signals as it is when using 50% duty cycle control signals. Accordingly, the use of pulsed control signals (e.g., Φ and Φ') may reduce the noise/jitter effect from the current source 302 being conductively coupled with the summer output nodes without affected the DFE correction range of the DFE circuit 300. In various embodiments, the sizes of the switches 304, 308, 312, and 314 (e.g., the sizes of the transistors that form the switches) may be selected to ensure that the voltage Vp at the drain node of the current source 302 does not rise high enough to shut off the current Idac.

In various embodiments, the length of the pulse time period (tpul) may be any suitable amount of time that is less than 1 UI of the clock signal (e.g., the half-rate clock signal). For example, in some embodiments, the pulse time period may half of the UI or less, such as about 10% of the UI. A shorter pulse time period may cause the voltage Vp to rise higher, so the length of the pulse time period and the size of the transistors of the IDAC may be selected to avoid the voltage Vp from rising high enough to shut off the current Idac.

In some embodiments, the first and/or second control signal may be generated from the clock signal (e.g., the first clock signal ck0 or the second clock signal ck180). For example, the first control signal may be generated by performing a NAND function of the clock signal and a delayed version of the clock signal. The amount of delay in the delayed version of the clock signal may determine the length of the pulse in the first control signal.

Figure 4:
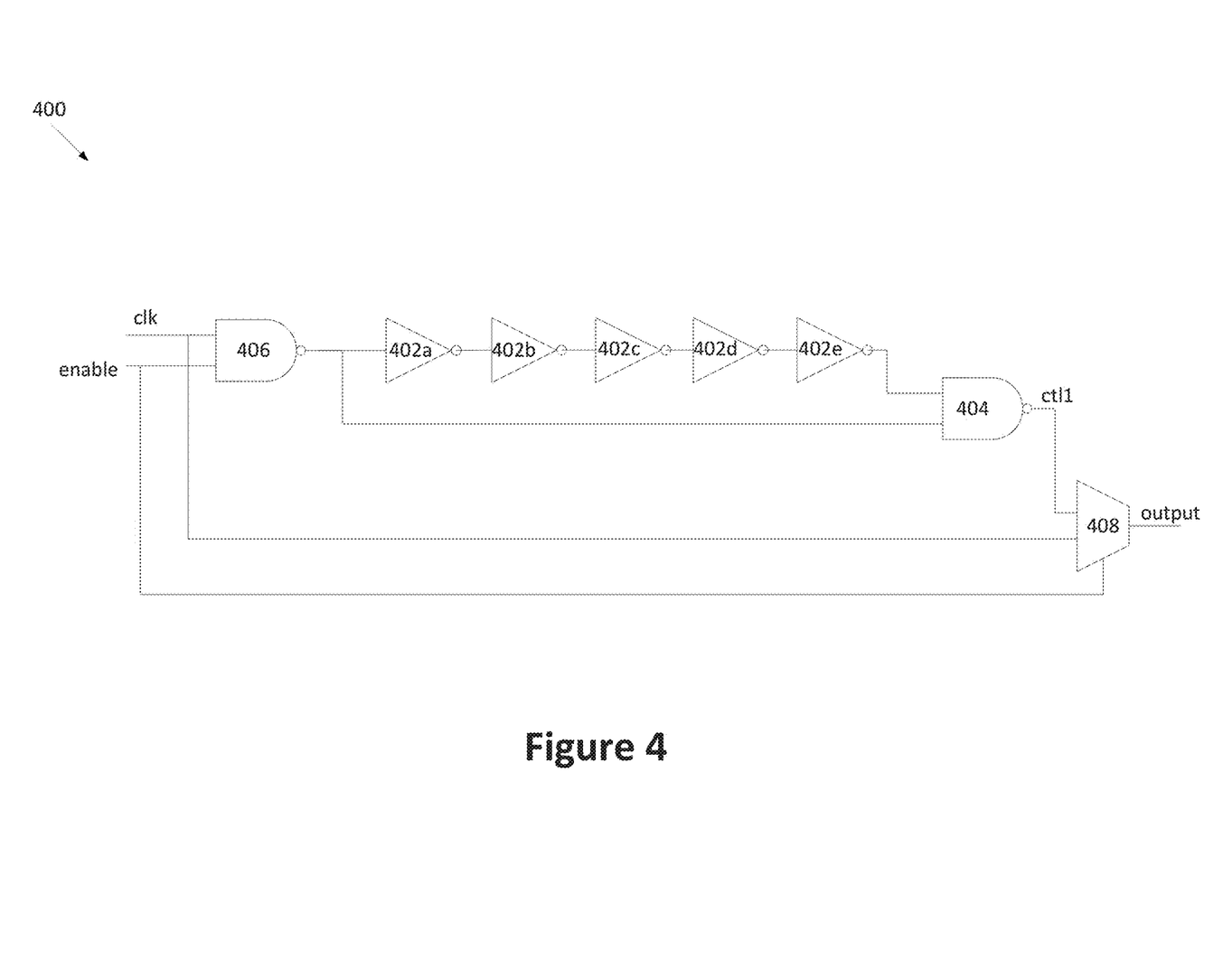
FIG. 4 schematically illustrates a pulse generation circuit, in accordance with various embodiments.

FIG. 4 schematically illustrates a pulse generation circuit 400 that may be used to generate the pulsed first control signal and/or second control signal, in accordance with various embodiments. The pulse generation circuit 400 may be included in the control circuit 104. The pulse generation circuit 400 may include a plurality of delay elements 402a-e (e.g., inverters or buffers) to delay the clock signal clk. The clock signal and the delayed version of the clock signal are passed to input terminals of a NAND gate 404. The output of the NAND gate 404 may be the pulsed control signal ctl1.

In some embodiments, the pulse generation circuit 400 may further include a NAND gate 406 and/or multiplexer 408 to allow the pulse generator circuit 400 to provide a selected one of the pulsed control signal or the clock signal as the output of the pulse generator circuit 400. The NAND gate 406 may receive the clock signal and an enable signal at its input terminals, and an output of the NAND gate 406 may be passed to the first delay element 402a. The multiplexer 408 may receive the pulsed control signal and the clock signal and may output a selected one of the pulsed control signal or the clock signal based on the value of the enable signal.

In various embodiments, the second control signal (ctl2) may be generated by another pulse generator circuit 400 based on the second clock signal (ck180).

As discussed above, in some embodiments, one or more correction circuit (e.g., IDAC) of the DFE circuit may not include the access transistors (e.g., access transistors 226 and 228 of IDAC 202a). In these embodiments, the data switches may receive pulsed versions of the signals that correspond to the prior bit (e.g., D1x, D1xb, D0x, D0xb) as control signals.

Figure 5:
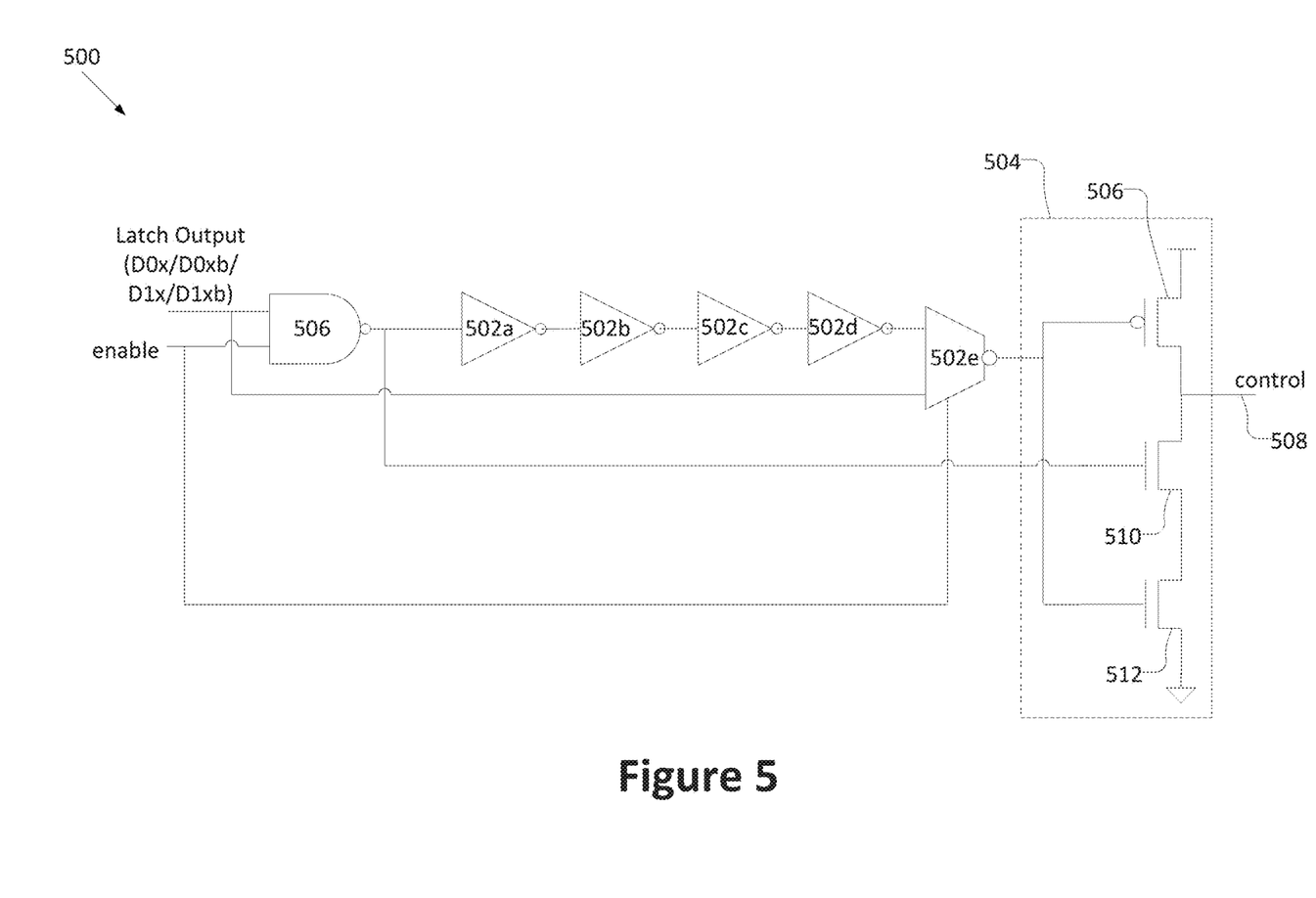
FIG. 5 schematically illustrates another pulse generation circuit, in accordance with various embodiments.

FIG. 5 illustrates a pulse generation circuit 500 that may be used to provide pulsed control signals for the data transistors of the IDAC (e.g., the data transistors 232a-d) in embodiments in which the IDAC does not include access transistors. The pulse generation circuit 500 may generate a pulsed version of the latch output signal (e.g., D0x, D0xb, D1x, or D1xb) to control the corresponding data transistor. The circuit 500 may be used, for example, for the IDAC 202a when the DFE circuit 200 uses soft decision data sampler outputs for the first tap (e.g., the outputs of latches 222a and 224a that are passed to IDAC 202a). With soft decision data sampler outputs, the output signals of the latches 222a and 224b may reset to voltage Vcc every other UI (e.g., during the odd cycle for the latch 222a on the even path and during the even cycle for the latch 224a on the odd path). The voltage Vcc may turn off the data transistors 232a-d, and thus the access transistors 226 and 228 may not be needed.

The pulse generation circuit 500 may include a plurality of delay elements 502a-e (e.g., inverters or buffers) to delay the latch output signal (e.g., D0x, D0xb, D1x, or D1xb). In some embodiments, the last delay element 502e in the string of delay elements may be a multiplexer that receives the latch output signal and the delayed version of the latch output signal and passes one of the latch output signal or the delayed version of the latch output signal to logic 504 based on the enable signal.

In various embodiments, logic 504 may receive the latch output signal and the output signal from the last delay element 502e (e.g., the latch output signal or the delayed latch output signal). For example, logic 504 may include a p-type transistor 506 coupled between a supply rail and an output terminal 508. The transistor 506 may receive the output signal from delay element 502e at its gate terminal. The logic 504 may further include n-type transistors 510 and 512 coupled between the output terminal 508 and ground. The gate terminal of the transistor 510 may be coupled to receive the latch output signal, and the gate terminal of the transistor 512 may be coupled to receive the output signal from the delay element 502e.

When the output signal from delay element 502e is low, transistor 506 may be on to pull the control signal at the output terminal 508 high (e.g., to Vcc). When the output signal from delay element 502e is high, the logic 504 may pull the control signal at the output terminal 508 low (e.g., to ground) if both the output signal from the delay element 502e and the latch output signal are high, otherwise the output terminal 508 may be floating. Accordingly, when the output signal of the delay element 502e is the delayed version of the latch output signal, the control signal may be a pulsed version of the latch output signal.

Figure 6:
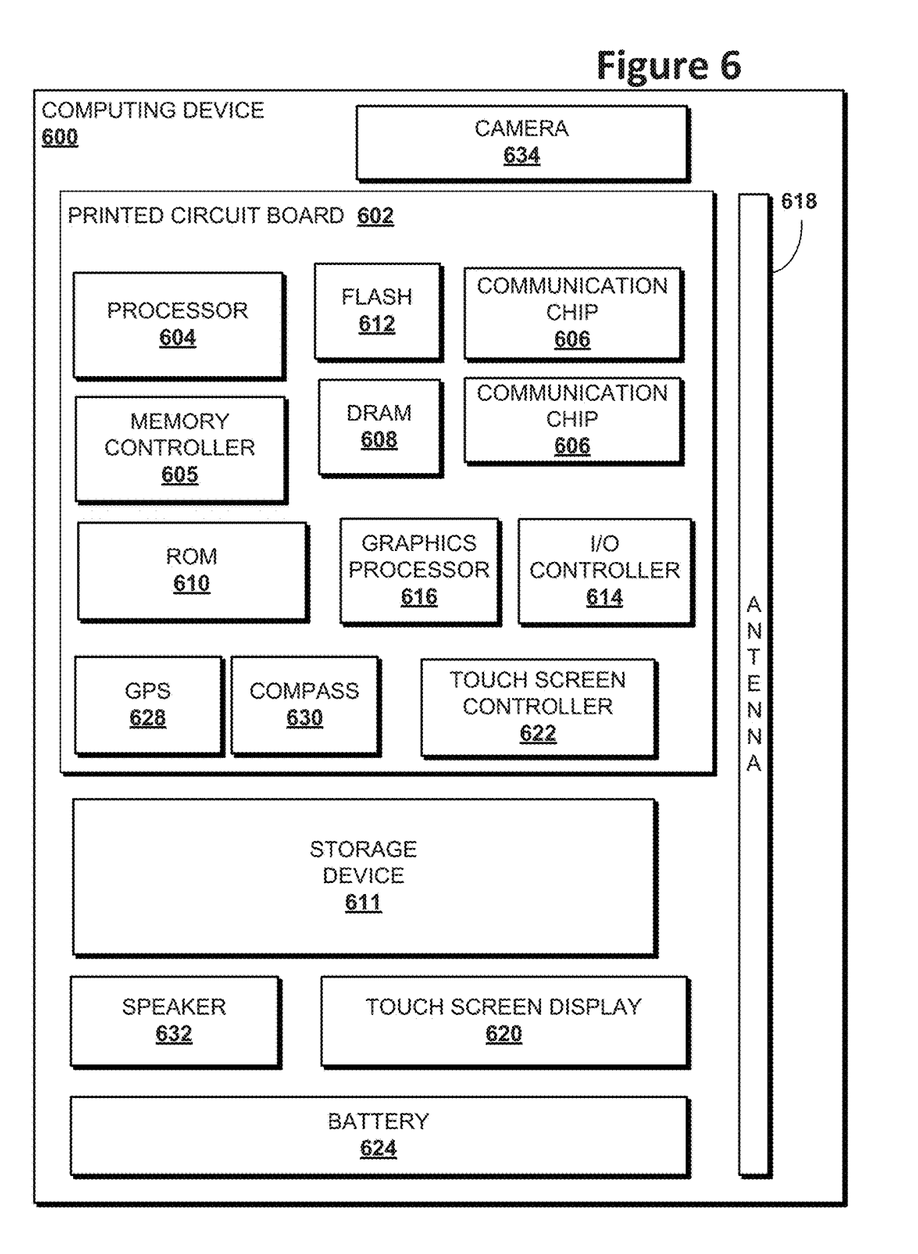
FIG. 6 illustrates an example system configured to employ the apparatuses and methods described herein, in accordance with various embodiments.

FIG. 6 illustrates an example computing device 600 that may employ the apparatuses and/or methods described herein (e.g., receiver circuit 100, DFE circuit 200, DFE circuit 300, pulse generation circuit 400, and/or pulse generation circuit 500), in accordance with various embodiments. As shown, computing device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, memory controller 605, volatile memory (e.g., dynamic random access memory (DRAM) 608), non-volatile memory such as read only memory (ROM) 610, flash memory 612, storage device 611 (e.g., a hard-disk drive (HDD)), an I/O controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system (GPS) device 628, a compass 630, an accelerometer (not shown), a gyroscope (not shown), a speaker 632, a camera 634, and a mass storage device (such as hard disk drive, a solid state drive, compact disk (CD), digital versatile disk (DVD)) (not shown), and so forth.

In some embodiments, the one or more processor(s) 604, flash memory 612, and/or storage device 611 may include associated firmware (not shown) storing programming instructions configured to enable computing device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 612, or storage device 611.

In various embodiments, one or more components of the computing device 600 may include the receiver circuit 100, DFE circuit 200, DFE circuit 300, pulse generation circuit 400, and/or pulse generation circuit 500 described herein. For example, the receiver circuit 100, DFE circuit 200, DFE circuit 300, pulse generation circuit 400, and/or pulse generation circuit 500 may be included in I/O controller 614, processor 604, memory controller 605, and/or another component of computing device 600. In some embodiments, I/O controller 614 may interface with one or more external devices to receive a data signal using the receiver circuit 100, DFE circuit 200, DFE circuit 300, pulse generation circuit 400, and/or pulse generation circuit 500. Additionally, or alternatively, the receiver circuit 100, DFE circuit 200, DFE circuit 300, pulse generation circuit 400, and/or pulse generation circuit 500 may be used to receive a data signal transmitted between two components of the computing device 600.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 600 may be any other electronic device that processes data.

Some non-limiting Examples are provided below.

Example 1 is a decision feedback equalization (DFE) circuit comprising: a current integrating summer (CIS) circuit coupled to a data node, the CIS circuit to generate a data signal at the data node based on an input data signal and a clock signal; and a correction circuit coupled to the data node to provide a correction signal to the data node based on a prior bit of the input data signal, wherein the correction circuit is to provide the correction signal for a time period that is less than one unit interval (UI) of the clock signal.

Example 2 is the DFE circuit of Example 1, wherein the correction circuit includes: a current source; an access transistor coupled between the current source and the data node, wherein the access transistor is responsive to a control signal to conductively couple the current source to the data node for the time period.

Example 3 is the DFE circuit of Example 2, wherein the data node is a first data node and the data signal is a first data signal, wherein the DFE circuit further includes a second data node to receive a second data signal that forms a differential pair with the first data signal, and wherein the correction circuit further includes: a first data transistor coupled between the access transistor and the first data node to selectively pass the correction signal to the first node when the prior bit of the data signal has a first value; and a second data transistor coupled between the access transistor and the second data node to selectively pass the correction signal to the second node when the prior bit of the data signal has a second value.

Example 4 is the DFE circuit of Example 2, further comprising a control circuit to generate the control signal based on the clock signal, wherein the control signal pulses on for the time period responsive to a transition in the clock signal.

Example 5 is the DFE circuit of Example 4, wherein the control circuit is to generate the control signal based on a NAND function of the clock signal and a delayed version of the clock signal.

Example 6 is the DFE circuit of Example 1, wherein the data node is an even data node, wherein the data signal is an even data signal, wherein the CIS circuit is to generate the even data signal and an odd data signal based on the input data signal, wherein the CIS circuit is to pass the odd data signal to an odd data node, and wherein the correction circuit includes: a current source; a first access transistor coupled between the current source and the even data node, wherein the first access transistor is responsive to a first control signal to conductively couple the current source to the even data node for the time period during an even cycle of the input data signal; and a second access transistor coupled between the current source and the odd data node, wherein the second access transistor is responsive to a second control signal to conductively couple the current source to the odd data node for the time period during an odd cycle of the input data signal.

Example 7 is the DFE circuit of Example 1, wherein the correction circuit is a first correction circuit, the correction signal is a first correction signal, and the prior bit is a first prior bit, and wherein the DFE circuit further includes: a plurality of correction circuits including the first correction circuit, the plurality of correction circuits to provide respective correction signals to the data node based on different prior bits of the data signal; and a sampler circuit to provide the different prior bits to the plurality of correction circuits.

Example 8 is the DFE circuit of any one of Examples 1 to 7, wherein the time period is about 5% to about 50% of the UI of the clock signal.

Example 9 is an apparatus comprising: means to provide a prior bit of a data signal that is passed on one or more data nodes and is associated with a clock signal; and means to provide, for a time period that is less than 1 unit interval (UI) of the clock signal, a correction signal to one or more of the one or more data nodes based on the prior bit of the data signal to correct for intersymbol interference (ISI) from the prior bit.

Example 10 is the apparatus of Example 9, wherein the data signal is a differential data signal that includes a positive data signal that is passed on a positive data node of the one or more data nodes and a negative data signal that is passed on a negative data node of the one or more data nodes, and wherein the means to provide the correction signal is to provide the correction signal to the positive data node for the time period if the prior bit has a first value and is to provide the correction signal to the negative data node for the time period if the prior bit has a second value that is different from the first value.

Example 11 is the apparatus of Example 9, wherein the data signal is divided into an even data signal that is passed on an even data node of the one or more data nodes and an odd data signal that is passed on an odd data node of the one or more data nodes, and wherein the apparatus further comprises: means to generate the even data signal and the odd data signal from an input data signal based on the clock signal.

Example 12 is the apparatus of Example 9, further comprising means to generate a control signal to trigger the means to provide the correction signal to provide the correction signal for the time period, wherein the control signal pulses on for the time period responsive to a transition in the clock signal.

Example 13 is the apparatus of any one of Examples 9 to 12, wherein the time period is about 5% to about 50% of the UI of the clock signal.

Example 14 is a system comprising: a processor; a receiver circuit coupled to the processor, the receiver circuit to receive an input data signal, wherein the receiver circuit includes a decision feedback equalization (DFE) circuit to generate a corrected data signal based on the input data signal, wherein the DFE circuit includes: a current integrating summer (CIS) circuit coupled to a data node, the CIS circuit to generate a data signal at the data node based on the input data signal; and a correction circuit coupled to the data node to provide a correction signal to the data node based on a prior bit of the input data signal, wherein the correction circuit is to provide the correction signal for a time period that is less than one unit interval (UI) of the data signal, and wherein the CIS circuit is to sum the correction signal with the data signal to generate the corrected data signal.

Example 15 is the system of Example 14, wherein the correction circuit includes: a current source; an access transistor coupled between the current source and the data node, wherein the access transistor is responsive to a control signal to conductively couple the current source to the data node for the time period to provide the correction signal.

Example 16 is the system of Example 15, wherein the data node is a first data node and the data signal is a first data signal, wherein the DFE circuit further includes a second data node to receive a second data signal that forms a differential pair with the first data signal, and wherein the correction circuit further includes: a first data transistor coupled between the access transistor and the first data node to selectively pass the correction signal to the first node when the prior bit of the data signal has a first value; and a second data transistor coupled between the access transistor and the second data node to selectively pass the correction signal to the second node when the prior bit of the data signal has a second value.

Example 17 is the system of Example 15, wherein the CIS circuit generates the data signal further based on a clock signal, wherein the DFE circuit further includes a control circuit to generate the control signal based on the clock signal, wherein the control signal pulses on for the time period responsive to a transition in the clock signal.

Example 18 is the system of Example 17, wherein the control circuit is to generate the control signal based on a NAND function of the clock signal and a delayed version of the clock signal.

Example 19 is the system of Example 14, wherein the time period is about 5% to about 50% of the UI of the data signal.

Example 20 is the system of Example 14, wherein the receiver circuit is to determine values of the input data signal based on the corrected data signal.

Example 21 is the system of Example 14, further comprising a network interface and a display coupled to the processor.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
   a current integrating summer (CIS) circuit coupled to a data node, the CIS circuit configured to generate a data signal at the data node based on an input data signal and a clock signal; and
   correction circuits coupled to the data node and configured to provide respective correction signals to the data node based on respective prior bits of the input data signal, wherein the correction circuits are configured to provide the respective correction signals to the data node simultaneously for a time period that is less than one unit interval (UI) of the clock signal.

2. The circuit of claim 1, wherein individual correction circuits of the correction circuits include:
   a current source; and
   an access transistor coupled between the current source and the data node, wherein the access transistor is responsive to a control signal to conductively couple the current source to the data node for the time period.

3. The circuit of claim 2, wherein the data node is a first data node and the data signal is a first data signal, wherein the circuit further comprises a second data node configured to receive a second data signal that forms a differential pair with the first data signal, and wherein the individual correction circuits further include:
   a first data transistor coupled between the access transistor and the first data node to selectively pass a first correction signal of the respective correction signals to the first data node when a prior bit of the data signal has a first value; and
   a second data transistor coupled between the access transistor and the second data node to selectively pass a second correction signal of the respective correction signals to the second data node when the prior bit of the data signal has a second value.

4. The circuit of claim 2, further comprising a control circuit configured to generate the control signal based on the clock signal, wherein the control signal pulses on for the time period responsive to a transition in the clock signal.

5. The circuit of claim 4, wherein the control circuit is configured to generate the control signal based on a NAND function of the clock signal and a delayed version of the clock signal.

6. The circuit of claim 1, wherein the data node is an even data node, wherein the data signal is an even data signal, wherein the CIS circuit is configured to generate the even data signal and an odd data signal based on the input data signal, wherein the CIS circuit is further configured to pass the odd data signal to an odd data node, and wherein individual correction circuits of the correction circuits include:
   a current source;
   a first access transistor coupled between the current source and the even data node, wherein the first access transistor is responsive to a first control signal to conductively couple the current source to the even data node for the time period during an even cycle of the input data signal; and
   a second access transistor coupled between the current source and the odd data node, wherein the second access transistor is responsive to a second control signal to conductively couple the current source to the odd data node for the time period during an odd cycle of the input data signal.

7. The circuit of claim 1, wherein the circuit further comprises:
   a sampler circuit configured to provide the respective prior bits to the correction circuits.

8. The circuit of claim 1, wherein the time period is 5% to 50% of the UI of the clock signal.

9. An apparatus comprising:
   means for providing prior bits of a data signal that is passed on one or more data nodes and is associated with a clock signal; and
   means for providing, simultaneously for a time period that is less than one unit interval (UI) of the clock signal, correction signals to one or more of the one or more data nodes based on respective ones of the prior bits of the data signal to correct for intersymbol interference (ISI) from the prior bits;
   wherein the data signal is a differential data signal that includes a positive data signal that is passed on a positive data node of the one or more data nodes and a negative data signal that is passed on a negative data node of the one or more data nodes, and wherein the means for providing the correction signals is to provide the respective correction signals to the positive data node for the time period if a respective prior bit of the prior bits has a first value and is to provide the respective correction signals to the negative data node for the time period if the respective prior bit of the prior bits has a second value that is different from the first value.

10. The apparatus of claim 9, wherein the data signal is divided into an even data signal that is passed on an even data node of the one or more data nodes and an odd data signal that is passed on an odd data node of the one or more data nodes, and wherein the apparatus further comprises:
   means for generating the even data signal and the odd data signal from an input data signal based on the clock signal.

11. The apparatus of claim 9, further comprising means for generating a control signal to trigger the means for providing the correction signals to provide the correction signals for the time period, wherein the control signal pulses on for the time period responsive to a transition in the clock signal.

12. The apparatus of claim 9, wherein the time period is 5% to 50% of the UI of the clock signal.

13. A system comprising:
   a processor; and
   a receiver circuit coupled to the processor, the receiver circuit configured to receive an input data signal, wherein the receiver circuit includes a decision feedback equalization (DFE) circuit configured to generate a corrected data signal based on the input data signal, wherein the DFE circuit includes:
      a current integrating summer (CIS) circuit coupled to a data node, the CIS circuit configured to generate a data signal at the data node based on the input data signal; and
      correction circuits coupled to the data node and configured to provide respective correction signals to the data node based on respective prior bits of the input data signal, wherein the correction circuits are configured to provide the correction signals to the data node simultaneously for a time period that is less than one unit interval (UI) of the data signal, and wherein the CIS circuit is configured to sum the correction signals with the data signal to generate the corrected data signal.

14. The system of claim 13, wherein individual correction circuits of the correction circuits include:

a current source; and
an access transistor coupled between the current source and the data node, wherein the access transistor is responsive to a control signal to conductively couple the current source to the data node for the time period to provide an individual correction signal of the respective correction signals.

15. The system of claim 14, wherein the data node is a first data node and the data signal is a first data signal, wherein the DFE circuit further includes a second data node configured to receive a second data signal that forms a differential pair with the first data signal, and wherein the individual correction circuits further include:
   a first data transistor coupled between the access transistor and the first data node to selectively pass the individual correction signal of the respective correction signals to the first data node when an individual prior bit of the respective prior bits of the data signal has a first value; and
   a second data transistor coupled between the access transistor and the second data node to selectively pass the individual correction signal to the second data node when the individual prior bit of the respective prior bits of the data signal has a second value.

16. The system of claim 14, wherein the CIS circuit generates the data signal further based on a clock signal, wherein the receiver circuit further includes a control circuit configured to generate the control signal based on the clock signal, wherein the control signal pulses on for the time period responsive to a transition in the clock signal.

17. The system of claim 16, wherein the control circuit is configured to generate the control signal based on a NAND function of the clock signal and a delayed version of the clock signal.

18. The system of claim 13, wherein the time period is 5% to 50% of the UI of the data signal.

19. The system of claim 13, wherein the receiver circuit is configured to determine values of the input data signal based on the corrected data signal.

20. The system of claim 13, further comprising a network interface and a display coupled to the processor.

* * * * *